United States Patent
Nakamura

(10) Patent No.: US 8,278,966 B2
(45) Date of Patent: Oct. 2, 2012

(54) SIGNAL OUTPUT CIRCUIT, OPTICAL PICKUP AND OPTICAL DEVICE

(75) Inventor: Masashi Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/217,648

(22) Filed: Jul. 8, 2008

(65) Prior Publication Data

US 2009/0045835 A1 Feb. 19, 2009

(30) Foreign Application Priority Data

Aug. 17, 2007 (JP) ................ P2007-213018

(51) Int. Cl.
- *H03K 17/16* (2006.01)
- *H03K 19/003* (2006.01)
- *H03B 1/00* (2006.01)
- *H03K 3/00* (2006.01)

(52) U.S. Cl. ........................ 326/30; 327/108
(58) Field of Classification Search .............. 326/30; 327/170

See application file for complete search history.

(56) References Cited

U.S. PATENT DOCUMENTS

| 6,839,286 | B2 * | 1/2005 | Cho et al. ............. 365/189.05 |
| 2003/0218477 | A1 * | 11/2003 | Jang et al. ............. 326/30 |
| 2004/0070351 | A1 * | 4/2004 | Roach ..................... 315/224 |
| 2005/0194663 | A1 * | 9/2005 | Ishimura ............... 257/666 |
| 2008/0080331 | A1 * | 4/2008 | Arai et al. ............. 369/44.12 |
| 2008/0164905 | A1 * | 7/2008 | Hamanaka ............. 326/30 |
| 2009/0179666 | A1 * | 7/2009 | Chujo et al. ........... 326/30 |
| 2010/0066405 | A1 * | 3/2010 | Chang et al. .......... 326/30 |

FOREIGN PATENT DOCUMENTS

JP 2007-053194 3/2007

* cited by examiner

*Primary Examiner* — Shawki S Ismail
*Assistant Examiner* — Dylan White
(74) *Attorney, Agent, or Firm* — Robert J. Depke; Rockey, Depke & Lyons, LLC

(57) ABSTRACT

Disclosed herein is a signal output circuit for outputting a signal onto a transmission line having a given transmission characteristic, the signal output circuit including a drive circuit adapted to drive an input signal by a current; and an output resistor which is connected to an output stage of the drive circuit and capable of adjusting the output signal waveform according to its resistance, wherein the drive current of the drive circuit and the resistance of the output resistor are variable.

11 Claims, 6 Drawing Sheets

SIGNAL OUTPUT CIRCUIT, OPTICAL PICKUP AND OPTICAL DEVICE

CROSS REFERENCES TO RELATED APPLICATIONS

The present invention contains subject matter related to Japanese Patent Application JP 2007-213018 filed in the Japan Patent Office on Aug. 17, 2007, the entire contents of which being incorporated herein by reference.

BACKGROUND OF THE INVENTION

1. Field of the Invention

The embodiment of the present invention relates to a signal output circuit, optical pickup and optical device for outputting a signal onto a transmission line having a given transmission characteristic.

2. Description of the Related Art

An optical disk pickup has to convey a signal to the signal processor at the subsequent stage via a relatively long flexible cable whose transmission characteristic varies from one product to another.

Therefore, elaborately thought-out ideas are desired at the output end of the transmitting circuit (IC), including addition of an optimal damping resistor for the flexible cable.

Signal transmission from the pickup to the IC at the subsequent stage has been optimized by adding a chip resistor to the output end of the IC incorporated in the pickup.

Media such as CD and DVD in high speed mode, BD and HD-DVD desire a signal band of 100 MHz or higher. A signal deteriorates if transmitted via FPC (Flexible Printed Circuit), FFC (Flat Flexible Cable) or other flexible transmission line.

Therefore, optical pickups available today have an external resistor (damping resistor) to adjust the transmission waveform, thus suppressing the resonance of the FPC and FFC and providing a more or less flat transmission characteristic at a frequency around 100 MHz.

FIG. 1 is an equivalent circuit diagram of the signal transmission system in a typical optical pickup.

In this circuit, a resistor Rd is externally added to the output side of the output circuit which is the transmitting IC of the optical pickup.

The resistance of the resistor Rd is adjusted to be optimal for a transmission line 2 such as flexible cable and an IC 3 at the subsequent stage.

This technique can ensure optimal transmission (suppress the peaking of the flexible transmission line) to a certain extent.

SUMMARY OF THE INVENTION

However, the need for an external component in the signal transmission system leads to an increased component count and larger substrate area in the optical pickup.

On the other hand, if load C is large, a large drive current is necessary. As a result, the signal transmission may not be optimized simply by adjusting the fixed output and resistor Rd.

It is an aim of the embodiment of the present invention to provide a signal output circuit, optical pickup and optical device capable of adjusting the signal waveform to suit each of transmission lines having different transmission characteristics without any external resistor and, by extension, ensure optimal signal transmission tailored to the transmission characteristic of the transmission line.

A first mode of the present invention is a signal output circuit adapted to output a signal onto a transmission line having a given transmission characteristic. The signal output circuit has a drive circuit and output resistor. The drive circuit drives an input signal by a current. The output resistor is connected to an output stage of the drive circuit and can adjust the output signal waveform according to its resistance. The drive current of the drive circuit and the resistance of the output resistor are variable.

Preferably, the drive current of the drive circuit and the resistance of the output resistor can be controlled according to the transmission characteristic of the transmission line.

Preferably, the drive circuit and output resistor are integrated in the same circuit.

Preferably, the drive circuit has a plurality of push-pull output stages disposed in parallel for a signal input. One end of each of the output resistors is connected to the output side of each of the plurality of push-pull output stages. The other ends of the output resistors are connected to a common output terminal.

Preferably, the output resistors of the drive circuit have different resistances.

Preferably, the drive circuit has a current source in the input-side circuit of each of the push-pull output stages. The operating conditions of the current sources are controlled by drive signals.

Preferably, at least the on/off operations or current values of the current sources are controlled by the drive signals.

An optical pickup according to a second mode of the present invention has a laser beam source, photoreceiving element and signal output circuit. The photoreceiving element converts a laser beam from the laser beam source or a beam returning from a recording medium into electric signal. The signal output circuit outputs the electric signal converted by the photoreceiving element onto a transmission line having a given transmission characteristic. The signal output circuit has a drive circuit and output resistor. The drive circuit drives an input signal by a current. The output resistor is connected to the output stage of the drive circuit and can adjust the output signal waveform according to its resistance. The drive current of the drive circuit and the resistance of the output resistor are variable.

An optical device according to a third mode of the present invention has an optical recording medium and optical pickup. The optical pickup has a laser beam source, photoreceiving element and signal output circuit. The photoreceiving element converts a laser beam from the laser beam source or a beam returning from a recording medium into electric signal. The signal output circuit outputs the electric signal converted by the photoreceiving element onto a transmission line having a given transmission characteristic. The signal output circuit has a drive circuit and output resistor. The drive circuit drives an input signal by a current. The output resistor is connected to the output stage of the drive circuit and can adjust the output signal waveform according to its resistance. The drive current of the drive circuit and the resistance of the output resistor are variable.

In the embodiment of the present invention, the optical pickup is controlled so that the resistance of the output resistor is increased, for example, if the resonance Q value of the transmission line is large. On the other hand, the optical pickup is controlled so that the current driving capability is increased, for example, if the current is insufficient.

DETAILED DESCRIPTION OF THE PREFERRED EMBODIMENT

The embodiment of the present invention eliminates the need for external resistor by integrating the drive circuit and output resistor in the same circuit, thus providing an effective way of downsizing the optical pickup.

Further, the embodiment of the present invention can adjust the signal waveform to suit each of transmission lines having different transmission characteristics without any external resistor and, by extension, ensure optimal signal transmission tailored to the transmission characteristic of the transmission line.

The preferred embodiment of the present invention will be described below with reference to the accompanying drawings.

Figure 1:
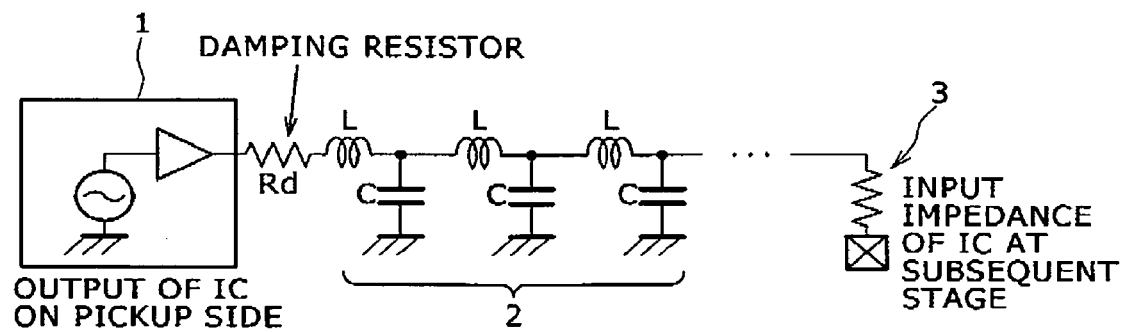
FIG. 1 is an equivalent circuit diagram of the signal transmission system in a typical optical pickup.
Figure 2:
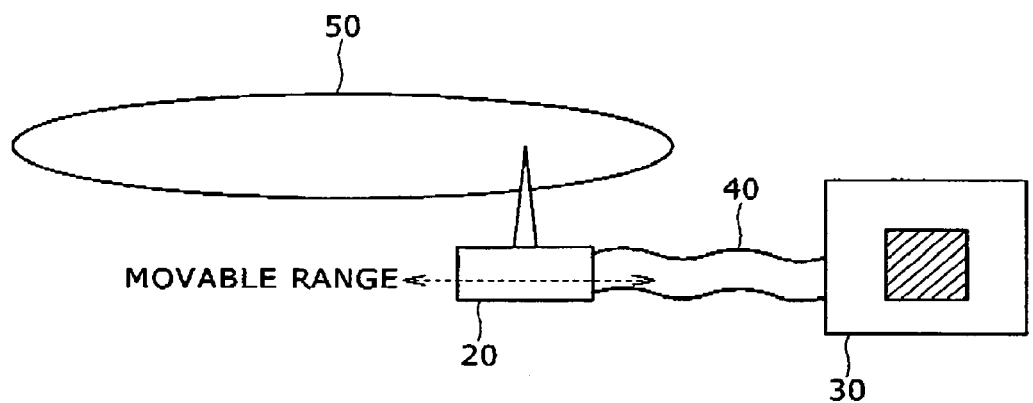
FIG. 2 is a diagram illustrating a configuration example of the major sections of an optical disk device as an information processing device according to an embodiment of the present invention.

FIG. 2 is a diagram illustrating a configuration example of the major sections of an optical disk device as an information processing device according to an embodiment of the present invention.

An optical disk device 10 has an optical pickup (OP) 20 and AFE (analog front end) mounting substrate 30. The optical pickup 20 is a movable section adapted to read a signal. The AFE mounting substrate 30 is a fixed section incorporating an AFE IC. The optical pickup 20 and AFE mounting substrate 30 are connected to a signal transmission line 40. In FIG. 2, reference numeral 50 represents an optical disk.

The transmission line 40 is formed with a flexible transmission line such as FPC (Flexible Printed Circuit) or FFC (Flat Flexible Cable).

Figure 3A:
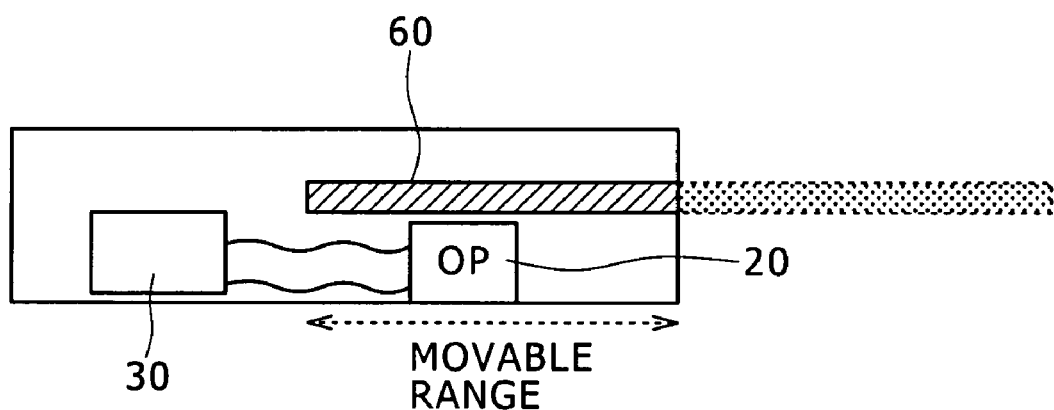
FIGS. 3A and 3B are diagrams illustrating a configuration example of a disk tray combined with an optical pickup.
Figure 3B:
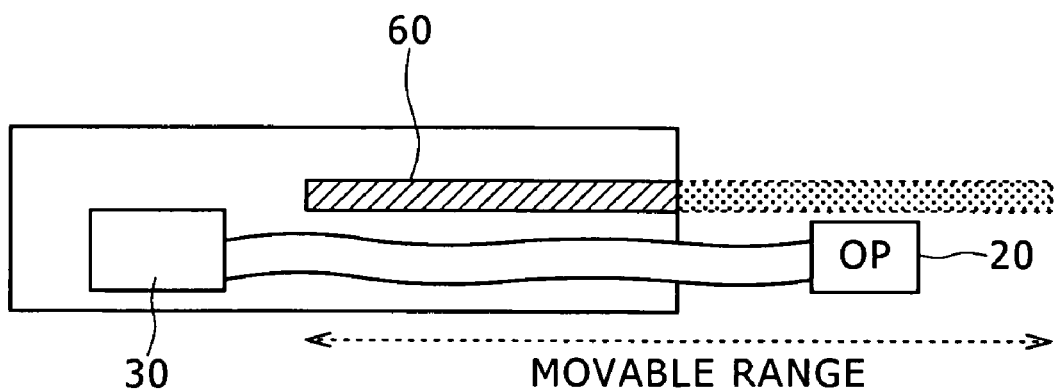

The transmission line 40 is configured, for example, so that a disk tray 60 and the optical pickup 20 are combined as illustrated in FIGS. 3A and 3B.

As a result, the transmission line 40 is longer by as much as the disk is opened.

Figure 4:
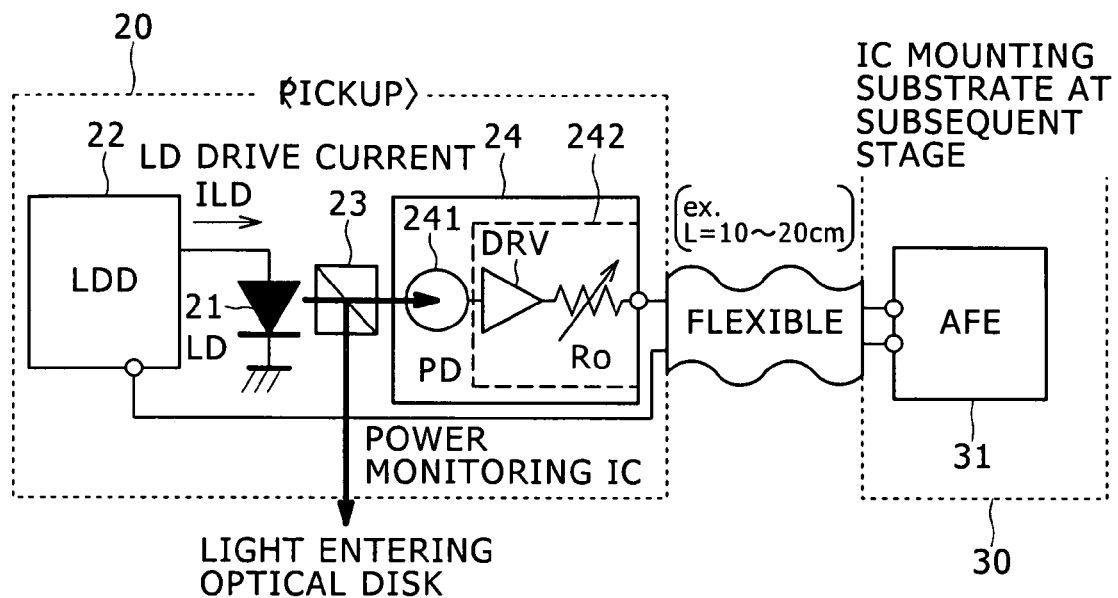
FIG. 4 is a diagram illustrating a configuration example of the major sections of the optical pickup according to the present embodiment.

FIG. 4 is a diagram illustrating a configuration example of the major sections of the optical pickup according to the present embodiment. FIG. 4 illustrates an auto power control (APC) system.

The optical pickup 20 in FIG. 4 has a laser beam source or a laser diode (hereinafter LD) 21, laser diode driver (hereinafter LDD) 22, polarized beam splitter 23 and power monitoring circuit (IC) 24.

Further, although not shown, the optical pickup 20 also has a photodiode adapted to convert the beam returning from the optical disk 50, an optical recording medium, into electric signal.

The power monitoring circuit 24 has a photoreceiving element or photodetector (hereinafter PD) 241 and signal output circuit 242.

The signal output circuit 242 includes a drive circuit (driver) DRV and output resistor R0. The driver DRV outputs an electric signal converted from the beam by the PD 241. The output resistor R0 is adapted to adjust the damping and connected to the output stage of the driver DRV.

In the present embodiment, the signal output circuit 242 is configured so that the output resistor R0 is formed (integrated) in the IC and so that the drive current of the driver DRV and the resistance of the output resistor can be controlled according to the transmission characteristic of the transmission line 40.

That is, in the present embodiment, the IC incorporating the signal output circuit 242 also incorporates a variable damping resistor. Alternatively, the IC incorporates, in the IC, a plurality of damping resistors which can be switched one from another. Further, the driving capability (bias current of the output circuit) can be varied. This ensures optimal signal transmission over the flexible transmission lines 40 having different transmission characteristics.

Thus, incorporation of the damping resistor R0 in the IC ensures reduced component count and mounting area. Further, controlling the output drive current makes it possible to respond to load variations of the flexible transmission line 40.

For example, the adjustment procedure varies depending on whether ringing in the signal waveform is caused by a large resonance Q value of the flexible transmission line 40 or insufficient current driving capability of the output of the signal output circuit (IC).

If the flexible transmission line 40 has a large resonance Q value, the optical pickup is controlled so that the output resistance is increased. If the drive current is insufficient, the optical pickup is controlled so that the current driving capability is increased.

Here, the reason why the output resistance and drive current have to be controlled will be described.

FIG. 4 illustrates a laser APC system. The LD 21 is driven by the LDD 22. The laser emission power of the LD 21 is determined by a drive current ILD caused to flow by the LDD 22.

Part of the laser beam emitted enters the PD 241 in the power monitoring circuit 24. This beam is converted into voltage form before being output.

The signal from the PD 241 is transmitted to the AFE mounting substrate 30 at the subsequent stage via the flexible transmission line 40.

An AFE (IC) 31 at the subsequent stage transmits a signal to the LDD 22. This signal is adapted to adjust the laser power according to the output signal.

The LDD 22 reflects the signal from the AFE 31 in the drive current ILD to adjust the laser power. The laser power is controlled to an arbitrary level set by this system.

The signal transmitted over the transmission line 40 by this system differs between when data is read from the optical disk 50 and when data is written thereto.

During reading, the LD 21 operates in DC mode. Therefore, high-speed signal transmission does not take place. As a result, the signal is hardly affected by the transmission characteristic of the flexible transmission line 40.

During writing, however, the LD 21 operates in pulsed mode. As a result, a high-speed signal is transmitted.

The pulse signal fed to the power monitoring circuit 24 is fast. Therefore, the IC output signal thereof is affected by the transmission characteristic of the flexible transmission line 40.

Figure 5:
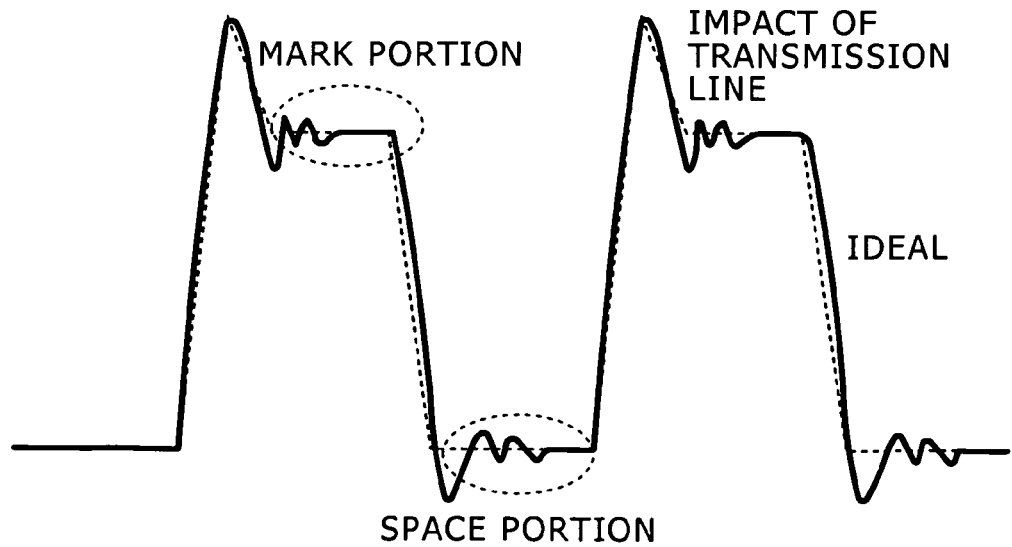
FIG. 5 is a diagram illustrating an example of writing waveform.

FIG. 5 is a diagram illustrating an example of writing waveform.

Depending on the transmission characteristic of the transmission line 40, ringing may occur in the pulse waveform as illustrated in FIG. 5. This makes it difficult to accurately read the power level of the written portion (mark portion of the optical disk 50) or unwritten portion (space portion of the optical disk 50).

This is the reason why the output resistance and drive current have to be controlled.

Different adjustment procedures are used depending on whether ringing in the signal waveform is caused by a large resonance Q value of the flexible transmission line 40 or insufficient current driving capability of the IC output.

If the flexible transmission line 40 has a large resonance Q value, the optical pickup is controlled so that the output resistance is increased. If the drive current is insufficient, the optical pickup is controlled so that the current driving capability is increased.

Figure 6:
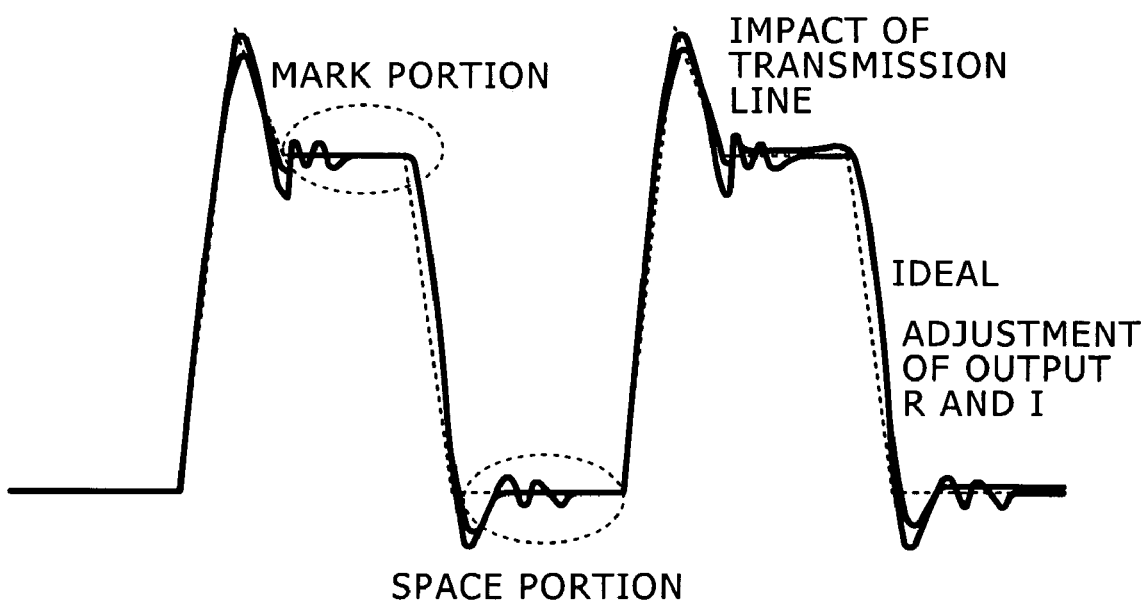
FIG. 6 is a diagram illustrating an example of writing waveform after adjustment according to the present embodiment.

FIG. 6 is a diagram illustrating an example of writing waveform after adjustment according to the present embodiment.

As illustrated in FIG. 6, this adjustment provides a waveform less affected by the transmission characteristic of the flexible transmission line 40.

A description will be given next of a specific configuration example of the signal output circuit according to the present embodiment and its functionality.

Figure 7:
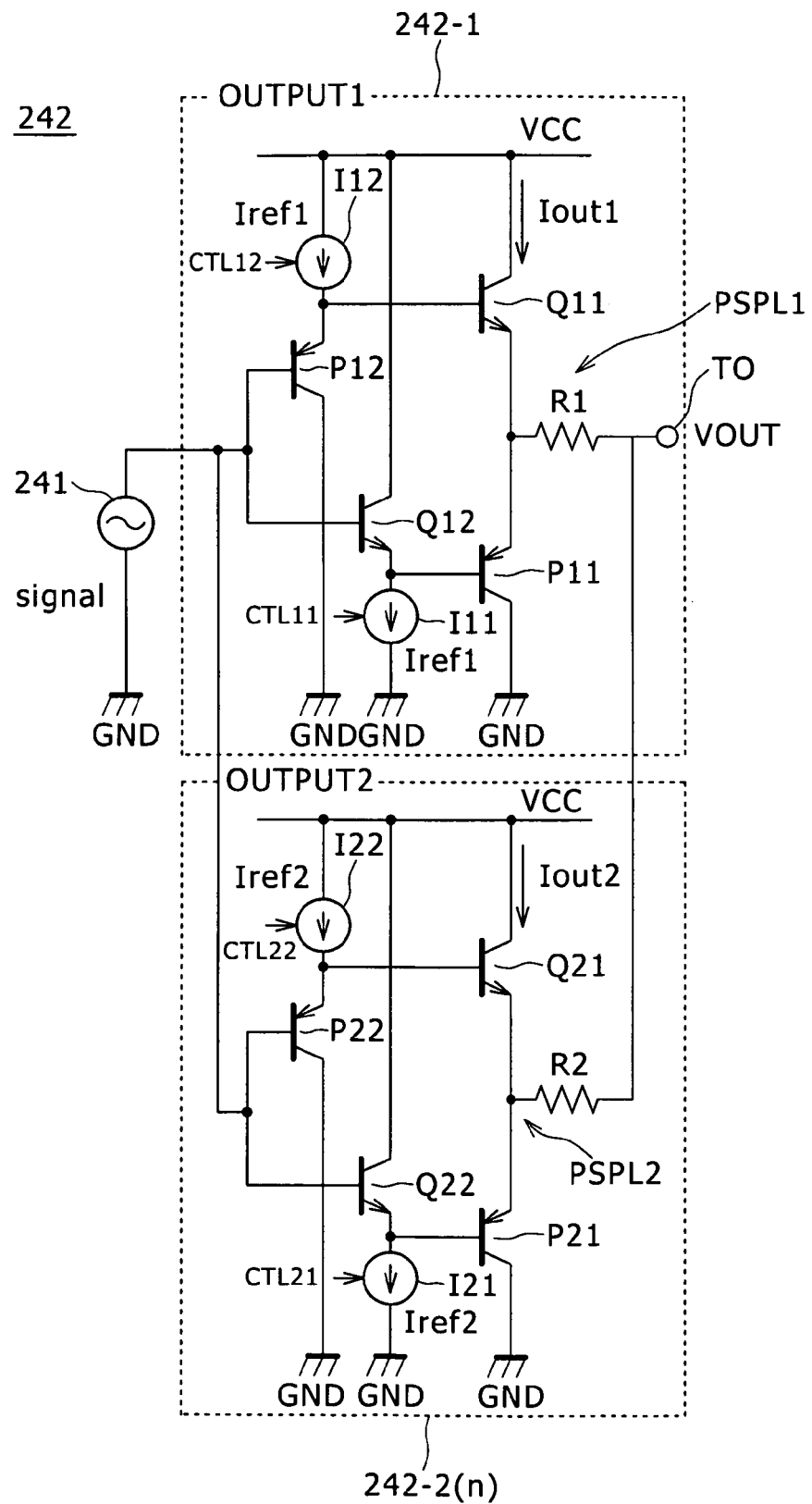
FIG. 7 is a circuit diagram illustrating a specific configuration example of a signal output circuit according to the present embodiment.

FIG. 7 is a circuit diagram illustrating a specific configuration example of the signal output circuit according to the present embodiment.

The signal output circuit 242 has a plurality (two in the example of FIG. 7) of output circuits 242-1 to 242-n (n=2 in FIG. 7) for a signal input.

The output circuit 242-1 includes pnp transistors P11 and P12, npn transistors Q11 and Q12, current sources I11 and I12 and output resistor R1.

The transistor P11 has its collector connected to a reference voltage which is, for example, a ground potential GND. The same transistor P11 has its emitter connected to the emitter of the transistor Q11 and one end of the output resistor R1. The same transistor P11 has its base connected to the emitter of the transistor Q12 and the current source I11. The output resistor R1 has its output end connected to an output terminal TO of the signal output circuit 242. Further, the current source I11 is connected to the ground potential GND.

The transistor Q11 has its collector connected to a source potential VCC. The same transistor has its base connected to the emitter of the transistor P12 and the current source I12. Further, the current source I12 is connected to the source potential VCC.

The transistor P12 has its collector connected to the ground potential GND. The transistor Q12 has its collector connected to the source potential VCC. The transistor P12 and the transistor Q12 have their bases connected commonly to the signal supply line of the PD 241 serving as a signal source.

Of these components, the transistors P11 and P12, transistors Q11 and Q12 and current sources I11 and I12 make up the driver DRV.

Further, the transistors P11 and Q11 each form an emitter follower. The emitters of the transistors P11 and Q11 are connected together. The connection point of the emitters is connected to one end of the output resistor R1 to form a so-called push-pull output stage PSPL1.

Still further, the on/off operations or current values of the current sources I11 and I12 are controlled by control signals CTL11 and CTL12 from an unshown control system.

The output circuit 242-2 includes pnp transistors P21 and P22, npn transistors Q21 and Q22, current sources I21 and I22 and output resistor R2.

The transistor P21 has its collector connected to a reference voltage which is, for example, the ground potential GND. The same transistor P21 has its emitter connected to the emitter of the transistor Q21 and one end of the output resistor R2. The same transistor P21 has its base connected to the emitter of the transistor Q22 and the current source I21. The output resistor R2 has its output end connected to the output terminal TO of the signal output circuit 242. Further, the current source I21 is connected to the ground potential GND.

The transistor Q21 has its collector connected to a source potential VCC. The same transistor has its base connected to the emitter of the transistor P22 and the current source I22. Further, the current source I22 is connected to the source potential VCC.

The transistor P22 has its collector connected to the ground potential GND. The transistor Q22 has its collector connected to the source potential VCC. The same transistor Q22 has its base connected commonly to the signal supply line of the PD 241 serving as a signal source.

Of these components, the transistors P21 and P22, transistors Q21 and Q22 and current sources I21 and I22 make up the driver DRV.

Further, the transistors P21 and Q21 each form an emitter follower. The emitters of the transistors P21 and Q21 are connected together. The connection point of the emitters is connected to one end of the output resistor R2 to form a so-called push-pull output stage PSPL2.

Still further, the on/off operations or current values of the current sources I21 and I22 are controlled respectively by control signals CTL21 and CTL22 from an unshown control system.

As described above, the signal output circuit 242 shown in FIG. 7 has the push-pull output stages PSPL1 and PSPL2 respectively for the output circuits 242-1 and 242-2. The output resistors R1 and R2 different in resistance from each other are provided respectively at the outputs of the push-pull output stages PSPL1 and PSPL2. The output ends of the output resistors R1 and R2 are connected to the output terminal TO of the signal output circuit 242.

Then, for example, during operation, the current sources of the desired output circuit, namely, the current sources I11 and I12 of a current Iref1 flowing through the output circuit 242-1 or the current sources I21 and I22 of a current Iref2 flowing through the output circuit 242-2, are activated. At the same time, the current sources of the unused output circuit, namely, the current sources I11 and I12 of the output circuit 242-1 or the current sources I21 and I22 of the output circuit 242-2, are kept inactive.

Further, the current sources of both of the output circuits, namely, the current sources I11 and I12 of the current Iref1 flowing through the output circuit 242-1 and the current sources I21 and I22 of the current Iref2 flowing through the output circuit 242-2, can be activated.

In this case, the output resistance is equal to the combined parallel resistance of the output resistors R1 and R2.

Output drive currents Iout1 and Iout2 change as the currents Iref1 and Iref2 from the current sources I11, I12, I21 and I22 are controlled, thus changing the current driving capability and output impedance.

As described above, the output drive currents Iout1 and Iout2 can be controlled to change by changing the currents Iref1 and Iref2.

The overall output resistance R0 of the signal output circuit 242 can be found by the following formula from the resistances and the current of the push-pull output stages PSPL1 and PSPL2.

$$R_0 = R + (RinQ/hfeQ + Vt/Iout)//(RinP/hfeP + Vt/Iout)$$

Here, Vt=kT/q, RinQ denotes the input impedance of the npn transistor Q and RinP the input impedance of the pnp transistor.

The drive current Iout is determined by the ratio between the transistors P12 and P11 of the output circuit 242-1 and the transistors P22 and P21 of the output circuit 242-2. The same current Iout is also determined by the ratio between the transistors Q12 and Q11 of the output circuit 242-1 and the transistors Q22 and Q21 of the output circuit 242-2.

Letting the size (e.g., emitter area) of the transistors P11 and P12 be denoted by P1, the size (e.g., emitter area) of the transistors P21 and P22 by P2, the size (e.g., emitter area) of the transistors Q11 and Q12 by Q1, and the size (e.g., emitter area) of the transistors Q21 and Q22 by Q2, the drive current Iout can be found by the following formula when P1/P2=Q1/Q2:

$$Iout = P1/P2 \times Iref = Q1/Q2 \times Iref$$

In the above configuration, we assume that the resistance of the output resistor R1 of the output circuit 242-1 is set larger than that of the output resistor R2 of the output circuit 242-2 and that the current driving capability of the output circuit 242-2 is set larger than that of the output circuit 242-1.

In such a configuration, if the flexible transmission line 40 has a large resonance Q value, the current sources I11 and I12 of the output circuit 242-1 are activated while keeping the current sources I21 and I22 of the output circuit 242-2 inactive so that the output resistance is increased.

Further, if the drive current is insufficient, the current sources I21 and I22 of the output circuit 242-2 are activated while keeping the current sources I11 and I12 of the output circuit 242-1 inactive so that the current driving capability is increased.

Still further, if the flexible transmission line 40 has a large resonance Q value and the drive current is insufficient, the current sources I11 and I12 of the output circuit 242-1 are activated, for example, so that the output resistance is increased. At the same time, the same sources I11 and I12 are controlled by the control signals CTL11 and CTL12 so that the current Iref1 is increased, and the current sources I21 and I22 of the output circuit 242-2 are kept inactive.

As described above, in the present embodiment, the signal output circuit 242 includes the drive circuit (driver) DRV and output resistor R0. The driver DRV outputs an electric signal converted from a laser beam by the PD 241. The output resistor R0 is adapted to adjust the damping and connected to the output stage of the driver DRV. The signal output circuit 242 is configured so that the output resistor R0 is formed (integrated) in the IC and so that the drive current of the driver DRV and the resistance of the output resistor can be controlled according to the transmission characteristic of the transmission line 40. This provides the advantageous effects described below.

Integration (incorporation) of the output resistor in the same circuit (same IC) eliminates the need for an external resistor previously desired, thus providing an effective way of downsizing the pickup.

Further, the embodiment of the present invention permits adjustment of the signal waveform to suit each of transmission lines having different transmission characteristics without any external resistor and, by extension, ensures optimal signal transmission tailored to the transmission characteristic of the transmission line.

The embodiment of the present invention is effective for use in those systems operable to transmit signals over flexible or other cables and adjust the waveform with resistors, irrespective of whether an optical pickup is used.

As described above, the embodiment of the present invention is applicable irrespective of whether an optical disk is used.

Figure 8:
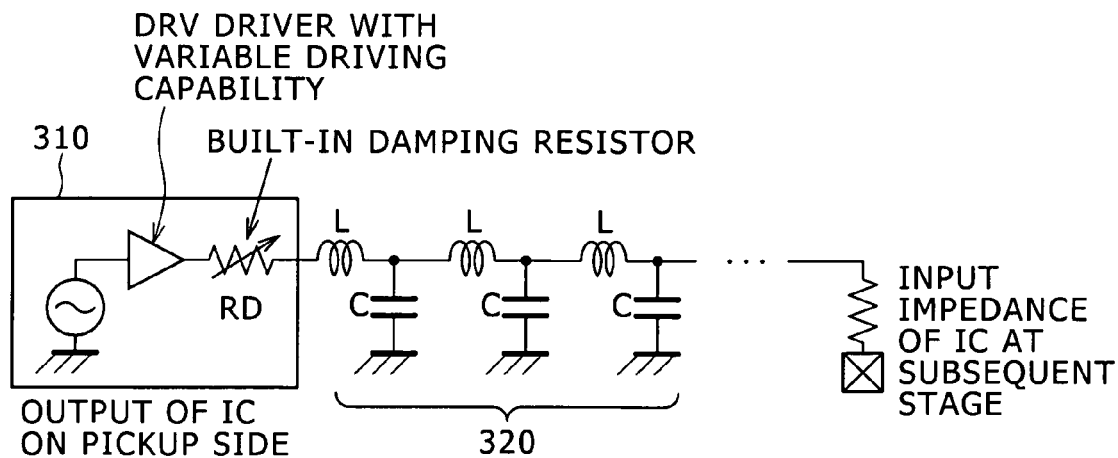
FIG. 8 is an equivalent circuit diagram of a system to which the embodiment of the present invention is applicable.

FIG. 8 is an equivalent circuit diagram of a system to which the embodiment of the present invention is applicable.

In a signal transmission system 300 shown in FIG. 8, a transmission line 320 having a given transmission characteristic is connected to a signal output circuit 310 incorporating the DRV with variable driving capability and an output resistor RD having a variable resistance. A receiving IC 330 is connected to the transmission line 320.

The embodiment of the present invention is effective for waveform adjustment when the transmission (output) resistance is low and the reception impedance is high in the signal transmission system 300.

The same advantageous effect can be achieved by lowering the reception input impedance. However, this technique leads to increased power consumption and other disadvantages. It is therefore more advantageous to use the system of the embodiment of the present invention.

It should be understood by those skilled in the art that various modifications, combinations, sub-combinations and alterations may occur depending on design requirements and other factor in so far as they are within the scope of the appended claims or the equivalents thereof.

What is claimed is:

1. A signal output circuit configured to output a signal onto a transmission line having a given transmission characteristic, the signal output circuit comprising:
    output circuitry which is connected to an output stage of a drive circuit and capable of adjusting an output signal waveform according to a resistance of the output circuitry, wherein circuit portions of the output circuitry are selectively activated to alter the resistance of the output circuitry in order to improve output signal characteristics for signals transferred via the transmission line, and further wherein at least one or both of the output resistance and the current driving capability is altered to improve signal transfer characteristics, and the output resistance and/or current driving characteristics are altered depending upon determined characteristics of the transmission line which is a flexible transmission line having transmission characteristics that are altered based on movement of the flexible transmission line, wherein different adjustment procedures are implemented depending upon whether ringing in a signal waveform transferred by the flexible transmission line is caused by a large resonance Q value for the flexible transmission line or insufficient current driving capability for an IC output.

2. The signal output circuit of claim 1, wherein
    the drive current of the drive circuit can be controlled according to the transmission characteristic of the transmission line.

3. The signal output circuit of claim 1, wherein
    the drive circuit and output circuitry are integrated in the same circuit.

4. The signal output circuit of claim 1, wherein
    the drive circuit has a plurality of push-pull output stages disposed in parallel for a signal input, one end of each of a plurality of output resistors is connected to the output side of each of the plurality of push-pull output stages, and the other ends of the output resistors are connected to a common output terminal.

5. The signal output circuit of claim 4, wherein
the output resistors of the drive circuit have different resistances.

6. The signal output circuit of claim 5, wherein
the drive circuit has a current source in the input-side circuit of each of the push-pull output stages, and
the operating conditions of the current sources are controlled by drive signals.

7. The signal output circuit of claim 6, wherein
at least the on/off operations or current values of the current sources are controlled by the drive signals.

8. The signal output circuit of claim 4, wherein
the drive circuit has a current source in the input-side circuit of each of the push-pull output stages, and
the operating conditions of the current sources are controlled by drive signals.

9. The signal output circuit of claim 8, wherein
at least the on/off operations or current values of the current sources are controlled by the drive signals.

10. The signal output circuit of claim 1, wherein both the output resistance and the current driving capability is altered to improve signal transfer characteristics.

11. The signal output circuit of claim 1, wherein a plurality of current sources are selectively activated, depending upon whether a high Q value is detected or an insufficient driving current is detected.

* * * * *